United States Patent
Morita et al.

(10) Patent No.: US 7,781,309 B2
(45) Date of Patent: Aug. 24, 2010

(54) METHOD FOR MANUFACTURING DIRECT BONDED SOI WAFER AND DIRECT BONDED SOI WAFER MANUFACTURED BY THE METHOD

(75) Inventors: Etsurou Morita, Tokyo (JP); Shinji Okawa, Tokyo (JP); Isoroku Ono, Tokyo (JP)

(73) Assignee: Sumco Corporation, Tokyo (JP)

( * ) Notice: Subject to any disclaimer, the term of this patent is extended or adjusted under 35 U.S.C. 154(b) by 480 days.

(21) Appl. No.: 11/614,681

(22) Filed: Dec. 21, 2006

(65) Prior Publication Data

US 2007/0148912 A1 Jun. 28, 2007

Related U.S. Application Data

(60) Provisional application No. 60/753,089, filed on Dec. 22, 2005.

(51) Int. Cl.
H01L 21/30 (2006.01)
H01L 21/46 (2006.01)

(52) U.S. Cl. .................. 438/459; 438/458; 438/455

(58) Field of Classification Search .................. 438/459
See application file for complete search history.

(56) References Cited

U.S. PATENT DOCUMENTS

| 6,900,113 | B2 * | 5/2005 | Nakano et al. ............. 438/455 |
| 7,541,263 | B2 * | 6/2009 | Moriceau et al. ........... 438/459 |
| 2003/0153251 | A1 * | 8/2003 | Mizushima .................. 451/44 |
| 2004/0009649 | A1 * | 1/2004 | Kub et al. ................... 438/459 |
| 2004/0082131 | A1 * | 4/2004 | Tsujikawa et al. .......... 438/287 |
| 2004/0259327 | A1 * | 12/2004 | Mitani ........................ 438/458 |

| 2005/0029224 | A1 | 2/2005 | Aspar et al. |

(Continued)

FOREIGN PATENT DOCUMENTS

JP 04-029353 1/1992

(Continued)

OTHER PUBLICATIONS

U.S. Appl. No. 11/614,792, filed Dec. 21, 2006, and entitled "Process for Regeneration of a Layer Transferred Wafer and Regenerated Layer Transferred Wafer".

(Continued)

*Primary Examiner*—Ha Tran T Nguyen
*Assistant Examiner*—Valerie Brown
(74) *Attorney, Agent, or Firm*—Greenblum & Bernstein, P.L.C.

(57) ABSTRACT

A direct bonded SOI wafer having an entire buried oxide film layer covered and not exposed is manufactured by: (A) forming a laminated body by laminating a semiconductor wafer and a support wafer via an oxide film; and (B) forming a thin-film single crystal silicon layer on the support wafer using a buried oxide film layer by film-thinning the semiconductor wafer to a predetermined thickness. In a process (C) the entire buried oxide film layer is covered by a main surface on the laminating side of the support wafer and the single crystal silicon layer. The covering of the entire buried film layer is carried out by, between process (A) and (B), removing the oxide film formed on the circumferential end edge of the main surface on the laminating side and the chamfered portion to leave the oxide film only on the laminated surface except the circumferential end edge.

20 Claims, 6 Drawing Sheets

U.S. PATENT DOCUMENTS

2005/0161808 A1* 7/2005 Anderson .................. 257/730

FOREIGN PATENT DOCUMENTS

| JP | 4-129267 | 4/1992 |
|---|---|---|
| JP | 08-195483 | 7/1996 |
| JP | 10-303089 | 11/1998 |
| JP | 11-204452 | 7/1999 |
| JP | 11-340443 | 12/1999 |
| JP | 2001-035827 | 2/2001 |
| JP | 2001-257139 | 9/2001 |
| JP | 2003-068996 | 3/2003 |
| JP | 2003-224247 | 8/2003 |
| WO | 02/084721 | 10/2002 |

OTHER PUBLICATIONS

U.S. Appl. No. 11/614,745, filed Dec. 21, 2006, and entitled "Process for Regeneration of a Layer Transferred Wafer and Regenerated Layer Transferred Wafer."
English language Abstract of JP 4-129267.
English language Abstract of JP 08-195483.
English language Abstract of JP 11-340443.
English language Abstract of JP 2003-224247.
English language Abstract of JP 2001-257139.
English language Abstract of JP 2003-068996.
English language Abstract of JP 2001-035827.
English language Abstract of JP 10-303089.
English language Abstract of JP 11-204452.
Office Action in Japanese Application No. 2003-209513 and English Translation.

* cited by examiner (a)

(b)

METHOD FOR MANUFACTURING DIRECT BONDED SOI WAFER AND DIRECT BONDED SOI WAFER MANUFACTURED BY THE METHOD

CROSS REFERENCE TO RELATED APPLICATIONS

This application is based upon and claims priority from U.S. Provisional Application No. 60/753,089, filed Dec. 22, 2005.

BACKGROUND OF THE INVENTION

1. Field of the Invention

The present invention relates to a method for manufacturing a direct bonded SOI (Silicon On Insulator) wafer by bonding two silicon wafers via a silicon oxide film, a so-called direct bonded SOI wafer manufacturing method and a direct bonded SOI wafer manufactured by the method. The present invention relates more particularly to a method for manufacturing a direct bonded SOI wafer in which the entire buried oxide film layer is covered and is not exposed and a direct bonded SOI wafer manufactured by the method.

2. Description of the Related Art

With high integration, high performance, multi-functions and high reliability of a semiconductor integrated circuit, a dimension of a pattern has become increasingly finer. With this, an SOI wafer having a thin-filmed SOI layer without a defect on a wafer surface layer to be a device-forming area with an oxide film layer between them is in demand. As a method for manufacturing this type of SOI wafer, there are methods such as a bonding method in which a thin-filmed active wafer is bonded to a support wafer for the creation thereof and the SIMOX (Separation by Implanted Oxygen) method in which an oxygen ion is implanted from a wafer surface to form a BOX layer in an area at a predetermined depth from the wafer surface.

Among them, with a method for manufacturing SOI wafer using a bonding method, as shown in FIG. 7(a), in order to obtain an SOI wafer 4, a semiconductor wafer 1 and a support wafer 2 are bonded together via an oxide film 3, and the semiconductor wafer 1 is formed to a desired thickness to be made into a single-crystal silicon layer. End edges 3a, 3a in a buried silicon oxide layer 3 of the obtained SOI wafer 4 are not buried but exposed on the side face. Therefore, in the semiconductor device manufacturing process, the exposed end edges 3a, 3a of the oxide film 3 are removed at the etching by a fluorinated acid solution or the like. As a result, as shown in FIG. 7B, end faces 1a, 1a of a single crystal silicon layer 1 corresponding to an upper layer are extended in the apprentice state. These extended portions 1a, 1a have a small thickness and a low mechanical strength, and they can be cracked or separated during various subsequent processing processes. Silicon pieces generated by this might become particles, adhere to the surface of the single crystal silicon layer 1 in the active area and cause a pattern defect or other defects in laminated films, which results in a problem that the product yield is lowered. Also, in the case of epitaxial growth, poly-silicon grows in an exposed oxide film portion, which results in a problem that particles are generated in the fluorinated acid processing process.

As a measure to improve these problems, a semiconductor substrate manufacturing process is known wherein, after removing a periphery portion of an SOI semiconductor substrate manufactured using the bonding method, a silicon oxide film layer interposed between an upper layer portion and a lower layer portion of the substrate is covered by a protective coating against a silicon oxide-film soluble agent at least on the side face of the substrate and then, an unnecessary portion of the coating is removed (See the Patent Document 1, for example).

Japanese Unexamined Patent Application No. 4-129267 (claim 5, p. 3, lower right column, 1. 12 to p. 5, upper right column, 1. 18 and FIGS. 2(A) to (M))

However, with the method disclosed in the Patent Document 1, there is a problem that the manufacturing cost is raised by increase in the number of processes since a process for covering the end edges from which the buried oxide films are exposed after bonding by a gas phase epitaxy and a process for removing a film formed by the gas phase epitaxy are added to processes generally performed in the bonding method.

An object of the present invention is to provide a method for manufacturing a direct bonded SOI wafer in which the entire buried oxide film layer is covered and not exposed and a direct bonded SOI wafer manufactured by the method.

Another object of the present invention is to provide a method for manufacturing a direct bonded SOI wafer which can reduce the manufacturing cost and a direct bonded SOI wafer manufactured by the method.

SUMMARY OF THE INVENTION

The invention according to claim 1 is, as shown in FIG. 1, the improvement of a method for manufacturing a direct bonded SOI wafer comprising the process of (A) forming a laminated body by laminating a semiconductor wafer and a support wafer via an oxide film; and the process of (B) forming a thin-film single crystal silicon layer on the support wafer using a buried oxide film layer by film-thinning the semiconductor wafer to a predetermined thickness, wherein a process (C) the entire buried oxide film layer is covered by a main surface on the laminating side of the support wafer and the single crystal silicon layer.

With the method for manufacturing a direct bonded SOI wafer disclosed herein, since the entire buried oxide film layer is covered by a main surface on the laminating side of the support wafer and the single crystal silicon layer, the side of the buried oxide film is not exposed. Also, since a process for the gas phase expitaxy is not added, the manufacturing cost can be reduced.

The present invention can provide a method for manufacturing a direct bonded SOI wafer wherein the covering of the entire buried oxide film layer in the process (C) is carried out by: forming the oxide film in process (A) on a main surface on either of the laminating side of the semiconductor wafer, the support wafer and on a chamfered portion continuing to this main surface, or on both the first and second main surfaces of the semiconductor wafer and/or the support wafer and on a chamfered portion continuing to both the first and second main surfaces, and between process (A) and (B), removing the oxide film formed on the circumferential end edge of the main surface on the laminating side and the chamfered portion to leave the oxide film only on the laminating surface and not on the circumferential end edge.

With the method for manufacturing a direct bonded SOI wafer disclosed herein, by removing the oxide film formed on the circumferential end edge and the chamfered portion, drop of product yield caused by the oxide film exposed from the side face can be prevented, and since the oxide film is left only on the laminating surface except the circumferential end edge, a high-quality SOI wafer can be obtained.

The invention can also provide a method for manufacturing a direct bonded SOI wafer, wherein the film-thinning of the semiconductor wafer in process (B) is carried out by mechanical processing, chemical etching or gas-phase etching of the semiconductor wafer.

The invention can also provide a method for manufacturing a direct bonded SOI wafer, wherein the film-thinning of the semiconductor wafer in process (B) is carried out by mechanical processing comprising grinding and polishing the side opposite to laminating side of the semiconductor wafer after the laminating step.

The invention can also provide a method for manufacturing a direct bonded SOI wafer, wherein the film-thinning of the semiconductor wafer in process (B) is carried out by mechanical processing comprising cutting the semiconductor wafer in parallel with the main surface after the laminating step.

With the method for manufacturing a direct bonded SOI wafer disclosed herein, the cut wafer obtained by cutting the semiconductor wafer in parallel with the main surface can be reused as a semiconductor wafer for bonding by applying grinding and polishing to processing distortion generated on its cut surface.

The invention can also provide a method for manufacturing a direct bonded SOI wafer, wherein as shown in FIG. 2, the film-thinning of the semiconductor wafer in process (B) is carried out by implanting an ion on the main surface on the laminating side of the semiconductor wafer and on a chamfered portion continuing to the main surface to form an ion implanted area inside the semiconductor wafer and by separating and removing the semiconductor wafer from the thin-film layer in the ion implanted area by applying heat treatment to the laminated body at a predetermined temperature after the laminating step.

With the method for manufacturing a direct bonded SOI wafer disclosed herein, a layer transferred wafer obtained by separation in the ion implanted area from the thin-film layer can be reused as a semiconductor wafer for bonding by applying grinding and polishing to a defect generated by the ion implanting.

The invention can also provide a method for manufacturing a direct bonded SOI wafer, wherein as shown in FIG. 3, the film-thinning of the semiconductor wafer in process (B) is carried out by producing a poromeric porous silicon layer by anodization on the main surface on the laminating side of the semiconductor wafer and on a chamfered portion continuing to the main surface, by forming a single crystal silicon thin-film layer by epitaxial growth after a hydrogen annealing treatment on the porous silicon layer in this order, forming the oxide film on the main surface on the laminating side of either of the single crystal silicon thin-film layer, the support wafer or both and on a chamfered portion continuing to the main surface, and separating and removing the semiconductor wafer from the single crystal silicon thin-film layer in the porous silicon layer by applying heat treatment to the laminated body after laminating at a predetermined temperature.

With the method for manufacturing a direct bonded SOI wafer disclosed herein, the separated semiconductor wafer can be reused by forming the porous silicon layer by anodization again after the porous silicon layer is removed by polishing.

The invention can also provide a method for manufacturing a direct bonded SOI wafer, wherein the removal of the oxide film between process (A) and process (B) is carried out by polishing.

The invention can also provide a method for manufacturing a direct bonded SOI wafer, wherein the removal of the oxide film between process (A) and process (B) is carried out by chemical etching.

The invention can also provide a method for manufacturing a direct bonded SOI wafer, wherein the chemical etching is carried out with an HF solution with the weight ratio of $HF:H_2O$ within a range of 1:0 to 10.

With the method for manufacturing a direct bonded SOI wafer disclosed herein, only the oxide film formed on the circumferential end edge of the main surface and the chamfered portion on the laminating side can be removed by polishing and chemical etching.

The invention can also provide a method for manufacturing a direct bonded SOI wafer, wherein the main surface of the laminating side of the semiconductor wafer, the support wafer or both in process (A) is laminated after washing with an SC-1 solution under an oxidized atmosphere.

The invention can also provide a method for manufacturing a direct bonded SOI wafer, wherein the main surface of the laminating side of the semiconductor wafer, the support wafer in process (A) is laminated after washing with a solution containing an organic acid and ozone under an oxidized atmosphere.

The invention can also provide a method for manufacturing a direct bonded SOI wafer, wherein the main surface of the laminating side of the semiconductor wafer, the support wafer or both in process (A) is laminated after washing with a diluted HF solution wherein the weight ratio of $HF:H_2O$ is within the range of 1:50 to 400.

With the method for manufacturing a direct bonded SOI wafer disclosed herein, by laminating after washing with the SC-1 solution, the solution containing organic acid and ozone and the diluted HF solution, excessive heat stress or contamination hardly occurs in the direct bonded SOI wafer and OSF is also hard to occur.

The invention can also provide a direct bonded SOI wafer manufactured by the discloses methods.

With the invention, since the side face of the buried oxide film is not exposed, a high-quality SOI wafer can be obtained.

DETAILED DESCRIPTION OF THE PREFERRED EMBODIMENT

Next, the method for manufacturing a direct bonded SOI wafer according to the present invention will be described below.

A method for manufacturing a direct bonded SOI wafer of the present invention is improvement of a method for manufacturing a direct bonded SOI wafer comprising the process of (A) forming a laminated body by laminating a semiconductor wafer and a support wafer via an oxide film; and (B) forming a thin-film single crystal silicon layer on the support wafer using a buried oxide film layer by film-thinning the semiconductor wafer to a predetermined thickness, wherein in a process (C) the entire buried oxide film layer is covered by a main surface on the laminating side of the support wafer and the single crystal silicon layer. Since the entire buried oxide film layer is covered by the main surface of the support wafer on the laminating side and the single crystal silicon layer, the side face of the buried oxide film is not exposed. Also, since a process such as a gas phase epitaxy is not added, the manufacturing cost can be reduced.

Figure 1:
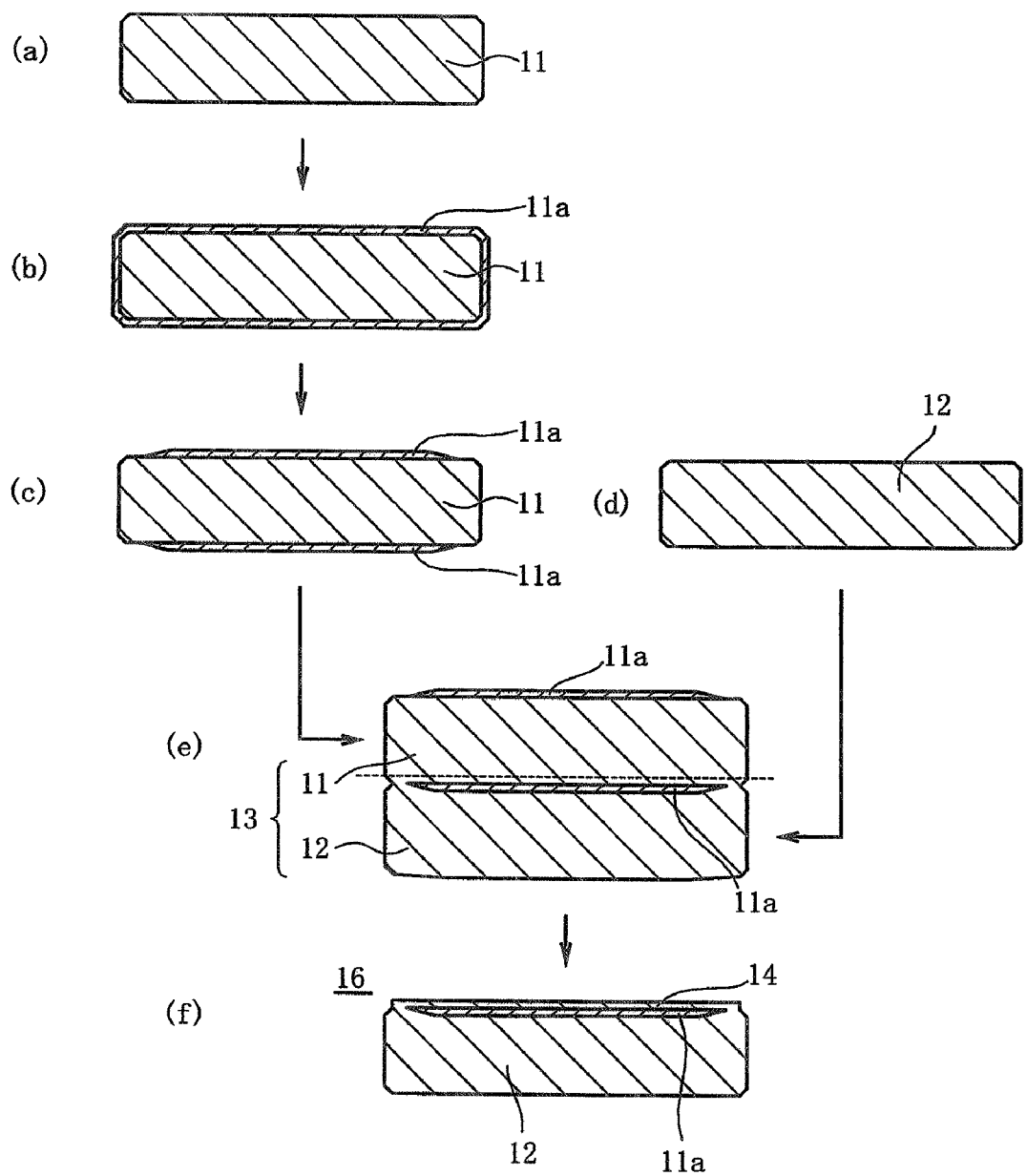
FIG. 1 is a diagram showing the method for manufacturing a direct bonded SOI wafer in the first preferred embodiment of the present invention in the order of processes.

More specifically, the covering of the entire oxide film layer of process (C) is carried out by, as shown in FIG. 1, forming the oxide film 11a in process (A) on the main surface of the semiconductor wafer 11, the support wafer 12 or both on the laminating side and the chamfered portion continuing to this main surface or formed on both the first and second main surfaces of the semiconductor wafer 11 and/or the support wafer 12 and on a chamfered portion continuing to both the first and second main surfaces, and between process (A) and process (B), by removing the oxide film formed on the circumferential end edge of the main surface on the laminating side and the chamfered portion to leave the oxide film only on the laminated surface and not on the circumferential end edge. By removing the oxide film formed on the circumferential end edge and the chamfered portion, drop of the product yield caused by the oxide film exposed from the side face can be prevented, and since the oxide film is left only on the laminated surface except the circumferential end edge, a high-quality SOI wafer can be obtained.

Next, the method for manufacturing a direct bonded SOI wafer in a first preferred embodiment of the present invention will be described based on the attached drawings.

As shown in FIG. 1, the semiconductor wafer 11 and the support wafer 12 produced by the Czochralski method and having the same diameter and the same thickness are prepared first (FIGS. 1(a) and 1(d)). The oxide film ($SiO_2$ film) 11a, which is an insulating film, is formed on the main surface of the wafer 11 by thermal oxidation of this semiconductor wafer 11 (FIG. 1(b)). Then, in the oxide film formed on the semiconductor wafer 11, the oxide film formed on the circumferential end edge of the main surface on the laminating side and the chamfered portion is removed to leave the oxide film only on the laminated surface except the circumferential end edge (FIG. 1(c)). As a method for removing the oxide film formed on the circumferential end edge of the main surface on the laminating side and the chamfered portion, polishing, chemical etching, etc. can be adopted.

Figure 5:
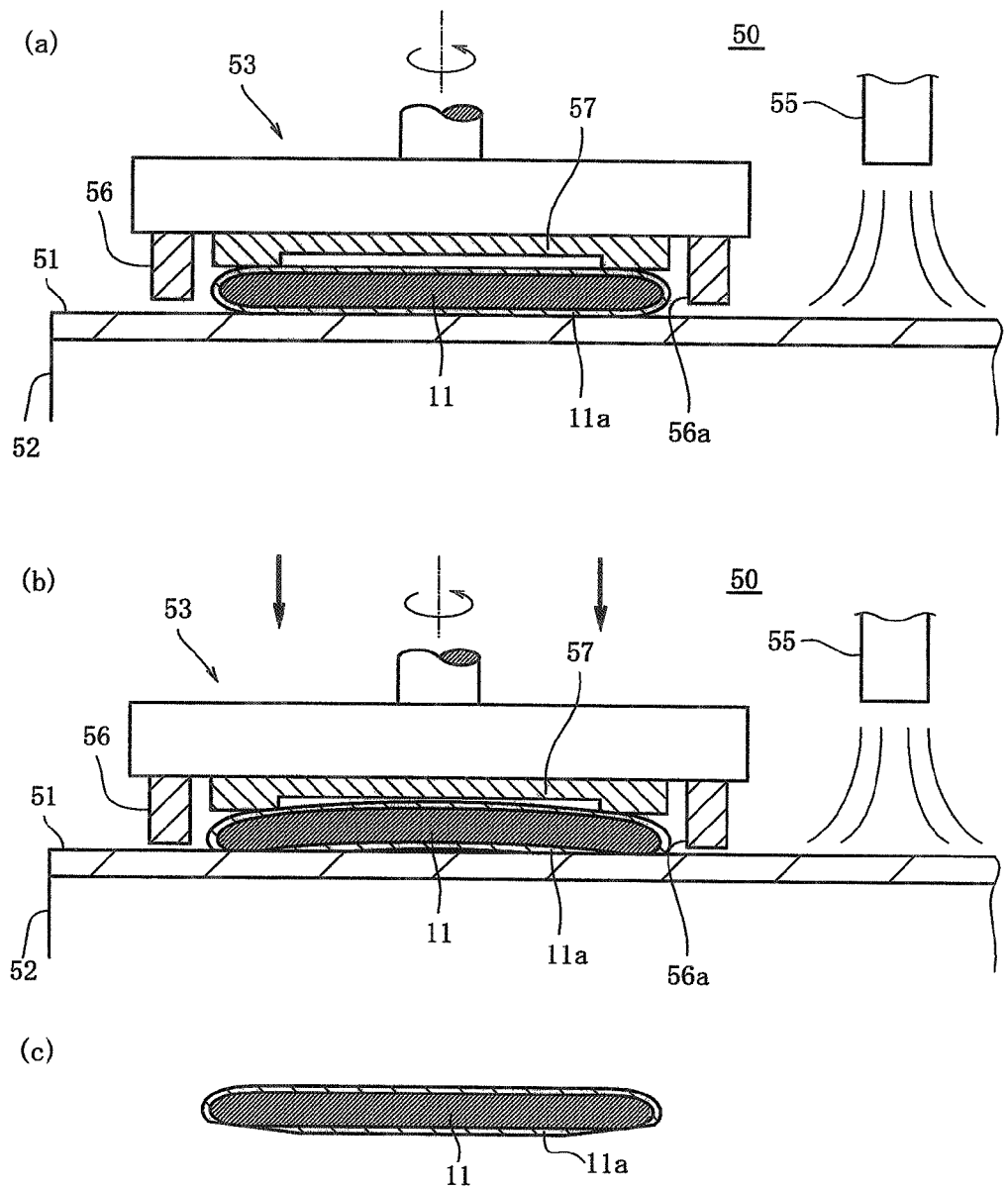
FIG. 5(a) is a diagram showing the method for polishing an oxide film on a circumferential end edge and a chamfered portion of a semiconductor wafer using a one-side polishing device.
FIG. 5(b) is a diagram corresponding to FIG. 5(a) showing the state where the semiconductor wafer is pressed onto a lower polishing surface plate.
FIG. 5(c) is a sectional view of the semiconductor wafer after polishing in which the oxide film on the circumferential end edge and the chamfered portion has been removed.

As a method for removing the oxide film by polishing, the following method can be used. Explanation will be made using the semiconductor wafer 11 in which the oxide film 11a is formed on both the main surfaces and the chamfered portion continuing to both the main surfaces. As shown in FIG. 5(a), a general one-side polishing device 50 is prepared. This one-side polishing device 50 is provided with a polishing surface plate 52 over which a polishing cloth 51 is extended and a polishing head 53 arranged above the polishing surface plate 52. An annular template 56 is fixed onto the lower face of the polishing head 53. A hole portion 56a with a diameter slightly larger than the diameter of the wafer is formed inside this template 56, and in this hole, a soft back pad 57 such as a suede pad, silicon rubber, non-woven cloth, etc. is contained. This back pad 57 has an O-ring shape with which only the wafer circumferential end edge and the chamfered portion are brought into contact. A nozzle 55 for supplying a polishing liquid toward the polishing cloth 51 is disposed above the polishing surface plate 52. Between this back pad 57 and the polishing cloth 51, the semiconductor wafer 11 is arranged so that the main surface on the laminating side is opposed to the polishing cloth 51. As shown in FIG. 5(b), when the semiconductor wafer 11 is pressed onto the polishing cloth 51 of the polishing surface plate 52, a center part of the wafer not in contact with the back pad 57 is deformed to project upward and only the oxide film on the wafer circumferential end edge is polished, but the oxide film on the wafer center part is hardly polished. By such a polishing method, as shown in FIG. 5C, only the oxide film on the circumferential end edge and the chamfered portion of the polished semiconductor wafer 11 is removed, while the oxide film 11a remains only on the laminated surface except the circumferential end edge.

Figure 6:
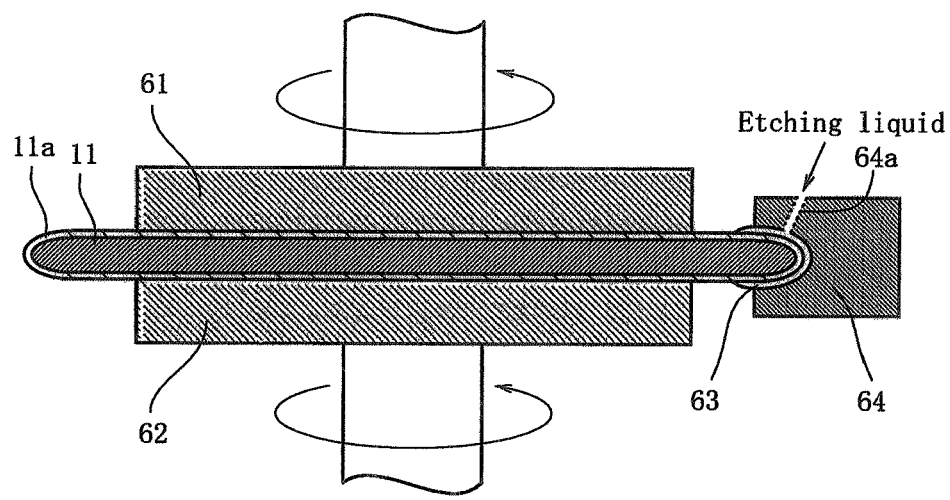
FIG. 6 is a diagram showing the method for etching the oxide film on the circumferential end edge and the chamfered portion of the semiconductor wafer.
Figure 7:
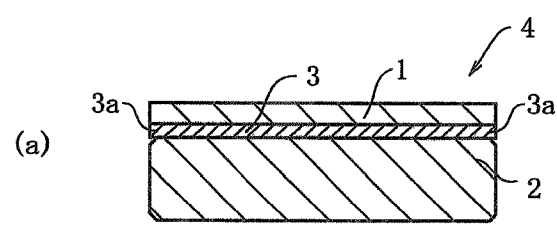
FIG. 7(a) is a sectional block diagram showing a conventional direct bonded SOI wafer and FIG. 7(b) is a sectional view of the SOI wafer corresponding to FIG. 7(a) showing the state where a buried oxide film exposed on the side face by etching has been removed and a single crystal silicon layer is extended.
Figure 7:
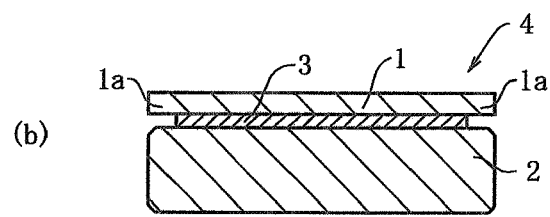

As a method for removing the oxide film by chemical etching, the following method can be used. Explanation will be made using the semiconductor wafer 11 in which the oxide film 11a is formed on both the main surfaces and the chamfered portion continuing to both the main surfaces. As shown in FIG. 6, the center part of the semiconductor wafer 11 is held between an upper chuck 61 and a lower chuck 62, and an etching roller 64 having the shape conforming to the wafer circumferential end edge and the chamfered portion is provided with a predetermined interval to the chamfered portion of the semiconductor wafer 11. A communication hole 64a is formed in an upper part of this etching roller 64 so that an etching liquid can be supplied from this communication hole 64a to the vicinity of the circumferential end edge and the chamfered portion of the wafer 11. The semiconductor wafer 11 is horizontally rotated by the upper chuck 61 and the lower chuck 62, and moreover, the etching liquid is supplied from the communication hole 64a. The etching liquid 63 which is brought into contact with the circumferential end edge and the chamfered portion of the wafer 11 does not spread to the center part of the wafer due to surface tension and centrifugal force but remains only on the circumferential end edge and the chamfered portion. By bringing the etching liquid into contact only with the circumferential end edge and the chamfered portion of the wafer 11 in this way, only the oxide film on the wafer circumferential end edge and the chamfered portion is removed. By this, in the semiconductor wafer 11, only the oxide film on the circumferential end edge and the chamfered portion is removed and the oxide film 11a remains only on the laminated surface except the circumferential end edge. The semiconductor wafer 11 shown in FIG. 1(c) is obtained by the etching method shown in FIG. 6.

The chemical etching is carried out by an HF solution with the weight ratio of $HF:H_2O$ within a range of 1:0 to 10. If the weight ratio of $HF:H_2O$ exceeds 1:10, the etching rate of the oxide film is slowed, and there is a problem that uniform removal of the oxide film becomes difficult.

Next, before a laminated body 13 is formed by laminating the semiconductor wafer 11 and the support wafer 12 via the oxide film 11a, it is preferable that the lamination is carried out after the main surfaces on the laminating side of the semiconductor wafer 11, the support wafer 12, or both are cleaned by the SC-1 solution, cleaned by a solution containing an organic acid and ozone or cleaned by a diluted HF solution with the weight ratio of HF:$H_2O$ within a range of 1:50 to 400 under the oxidized atmosphere before lamination. By cleaning with the SC-1 solution under the oxidized atmosphere, a natural oxide film grows on the main surface of the cleaned wafer and it has an effect on removal of particles. Also, by cleaning with the solution containing the organic acid and ozone under the oxidized atmosphere, a natural oxide film grows on the main surface of the cleaned wafer and it has an effect on removal of organic substances and particles. Moreover, by cleaning with a diluted HF solution, the HF molecule reacts to an Si—O bonding on the wafer surface to become an Si—F bonding. This Si—F bonding is polarized and susceptible to an attack of HF, and by this, Si on the main surface on the laminating side is desorbed as $SiF_4$, and the main surface on the laminating side is terminated by the H group. When this wafer is laminated and further subjected to heat treatment, $H_2$ is generated on the laminated interface. Since the volume of $H_2$ is extremely small, the $H_2$ generated here easily goes out of the laminated interface even if the heat treatment time is relatively short. As the result of this heat treatment, excessive heat stress or contamination hardly occurs in the direct bonded SOI wafer and OSF is also hard to occur. The weight ratio between water and HF (HF:$H_2O$) of the diluted HF solution is set to the range of 1:50 to 400 because in this concentration range, the density of OH group on the wafer laminated surface is made small, the amount of $H_2O$ generated on the interface by the heat treatment applied after the lamination step is decreased and the generation rate of voids in the peripheral portion of the direct bonded SOI wafer can be further reduced. If the weight ratio between water and HF (HF:$H_2O$) is less than 1:50, when F in the Si—F bonding on the wafer surface is substituted by the OH group, the ratio of OH group becomes so high that the void generation rate in the wafer outer circumferential portion is increased. Also, if the ratio of 1:400 is exceeded, there is a problem that it takes too much time to remove the natural oxide film.

Next, returning to FIG. 1, the laminated body 13 is formed by laminating the semiconductor wafer 11 on the main surface of the support wafer 12 using the oxide film 11a at a room temperature (FIG. 1(e)). The temperature of this laminated body 13 is raised to the range of 900 to 120° C. in the oxygen ($O_2$) or nitrogen ($N_2$) atmosphere and the heat treatment of the holding thereof is carried out in this temperature range for 30 to 120 minutes. This heat treatment is to strengthen the bonding of the semiconductor wafer 11 onto the support wafer 12.

Next, the semiconductor wafer 11 is thinned to a predetermined thickness (FIG. (f)). The film-thinning of the semiconductor wafer 11 is carried out by mechanical processing of the semiconductor wafer 11, chemical etching or gas-phase etching. The film-thinning by mechanical processing is carried out by grinding and polishing the side opposite to the laminating side of the semiconductor wafer 11 after the lamination step or by cutting the semiconductor wafer 11 in parallel with the main surface.

The cutting is carried out by cutting at a predetermined thickness position of the semiconductor wafer with a diamond inner diameter blade, for example, in parallel with the main surface, that is, in parallel with the bonded surface. An inner diameter blade cutting device is provided with, for example, a holding plate for holding and fixing the SOI wafer and an absorption plate arranged oppositely thereto for holding the SOI wafer to be cut between them. And the holding plate and the absorption plate are constituted capable of advancing and retreating in the direction perpendicular to the wafer surface, respectively, and the holding plate is provided with a dividing pitch mechanism and has a surface aligning function so that the inner circumferential blade is accurately arranged in parallel with the bonded surface of the SOI wafer to avoid the inclined cutting of the wafer. By using this type of cutting device, the semiconductor wafer of the bonded wafer can be cut easily at a predetermined position in parallel with the main surface and be divided into the SOI wafer and the cut wafer. The cut wafer can be reused as a semiconductor wafer for bonding by grinding and polishing the processing distortion generated on the cut surface.

Moreover, the thin-filmed surface of the semiconductor wafer 11 is subjected to the primary polishing and the thin-film layer 14 is smoothened in the subsequent final polishing (FIG. 1(f)). By this, the SOI wafer 16 in which the buried oxide film 11a is not exposed from the side face can be obtained.

Next, the method for manufacturing a direct bonded SOI wafer in the second preferred embodiment of the present invention will be described based on FIG. 2.

Figure 2:
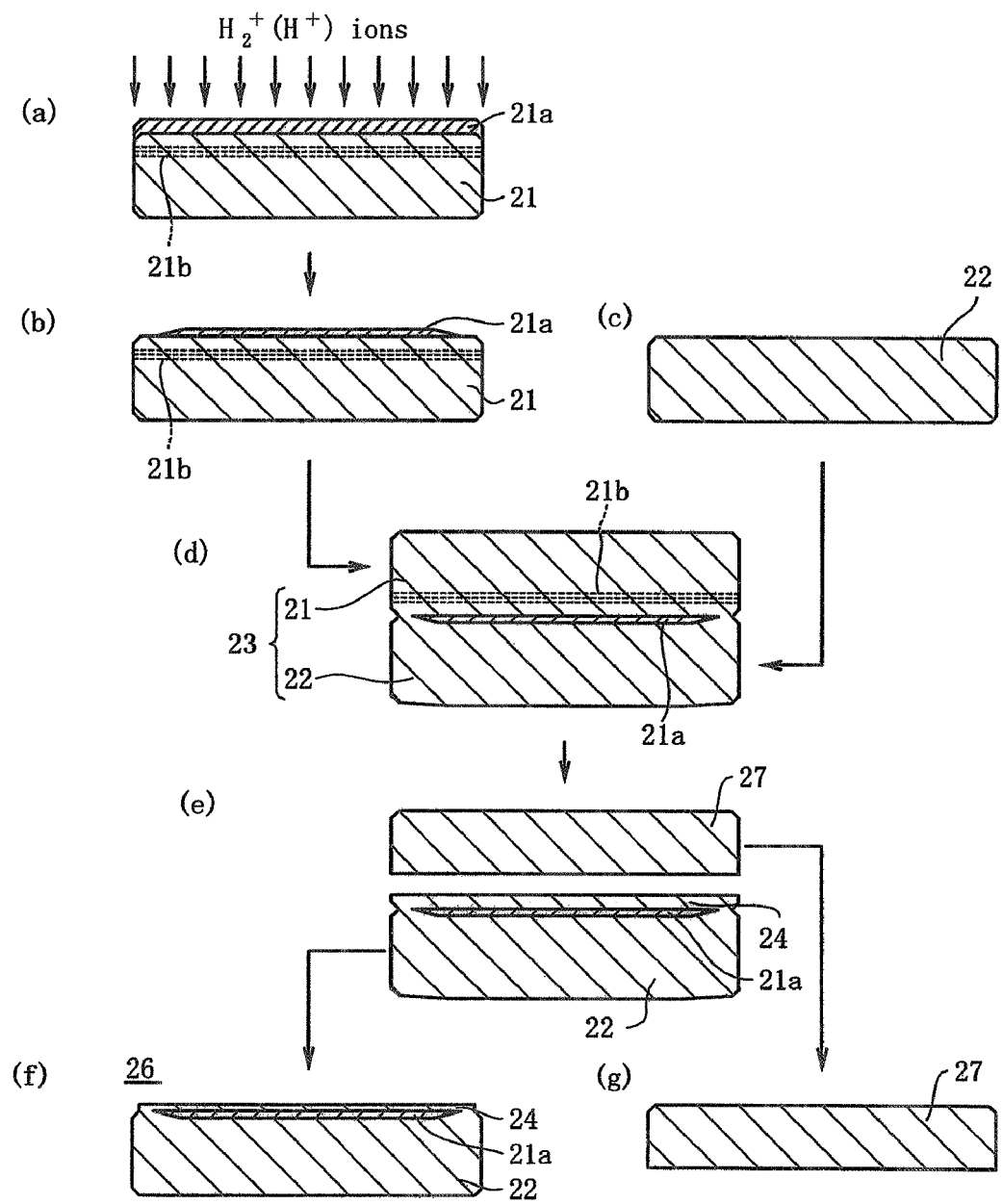
FIG. 2 is a diagram showing the method for manufacturing a direct bonded SOI wafer in the second preferred embodiment of the present invention in the order of processes.

As shown in FIG. 2, in this second preferred embodiment, the film-thinning of the semiconductor wafer 21 in process (B) is carried out by a so-called smart-cutting method that ions are implanted into the main surface of the semiconductor wafer 21 on the laminating side and the chamfered portion continuing to this main surface so as to form an ion implanted area 21b inside the semiconductor wafer 21, applying heat treatment to the laminated body 23 after the lamination step at a predetermined temperature and separating and removing the semiconductor wafer 21 in the ion implanted area 21b from the thin film layer 24.

In the case of this film-thinning, first, the oxide film ($SiO_2$ film) 21a, which is an insulating film, is formed on the main surface of the wafer 21 by thermal oxidation of the semiconductor wafer 21 before forming the laminated body 23, and then, hydrogen ions ($H^+$), which are hydrogen gas ions, are implanted in a dose amount of $3.0\times10^{16}$/$cm^2$ or more or hydrogen-molecule ions ($H_2^+$) in a dose amount of $1.5\times10^{16}$/$cm^2$ or more into the main surface of this wafer 21 (FIG. 2A). Here, the reference numeral 21b in FIGS. 2(a), 2(b) and 2(d) is an ion implanted area formed inside the semiconductor wafer by the implantation of the hydrogen gas ions or the hydrogen-molecule ions, and this ion implanted area 21b is formed in parallel with the oxide film 21a, that is, the surface of the semiconductor wafer 21. In the case of the hydrogen gas ion ($H^+$), about twice the implanting amount of the hydrogen-molecule ion ($H_2^+$) is required. Instead of implanting the hydrogen gas ion and the hydrogen-molecule ion, helium ions ($He^+$) may be implanted with the implantation of the hydrogen gas ions or the hydrogen-molecule ions. In this case, a dose amount of helium ions is preferably $0.5\times10^{16}$/$cm^2$ or more. The oxide film 21a may be formed on the whole surface of the semiconductor wafer 21, though not shown.

Then, in the oxide film formed on the semiconductor wafer 21, the oxide film formed on the circumferential end edge on the main surface on the laminating side and the chamfered portion is removed, and left only on the laminated surface except the circumferential end edge (FIG. 2(b)). In this process, the oxide film formed on the circumferential end edge and the chamfered portion is removed by the same method as in the above-mentioned first preferred embodiment. Next, the support wafer 22 is prepared (FIG. 2(*c*)), and the semiconductor wafer 21 is laminated on the main surface of this support wafer 22 via the oxide film 21*a* at a room temperature so as to form the laminated body 23 (FIG. 2(*d*)). The temperature of this laminated body 23 is raised to the range of 500 to 800° C. in an atmosphere of nitrogen (N$_2$) and kept in this temperature range for 5 to 30 minutes and thin-layer separation heat-treatment is carried out. By this, the semiconductor wafer 21 is split in the ion implanted area 21*b* and separated into an upper thick layer transferred wafer 27 and a lower thin layer 24 (FIG. 2(*e*)). Next, the temperature of the laminated body 23 in the above semiconductor wafer 21 split in the ion implanted area 21*b* is lowered, and the layer transferred wafer 27 is removed from the support wafer 22 onto which the thin film layer 24 is laminated using the oxide film 21*a* (FIGS. 2(*f*) and 2G). Heat treatment is carried out that the temperature of the above support wafer 22 is raised to the range of 900 to 1200° C. in an atmosphere of oxygen (O$_2$) or nitrogen (N$_2$) and the support wafer is kept in this temperature range for 30 to 120 minutes. This heat treatment is to strengthen the bonding of the thin film layer 24 onto the support wafer 22. Moreover, the separated surface of the support wafer 22 is smoothened by the annealing-treatment or the polishing (touch polishing) (FIG. 2(*f*)). By this, the SOI wafer 26 in which the buried oxide film 21*a* is not exposed from the side face can be obtained. The layer transferred wafer 27 can be reused as the semiconductor wafer 21 by polishing and smoothing the separated surface.

Next, the method for manufacturing the direct bonded SOI wafer in the third preferred embodiment of the present invention will be described based on FIG. 3.

Figure 3:
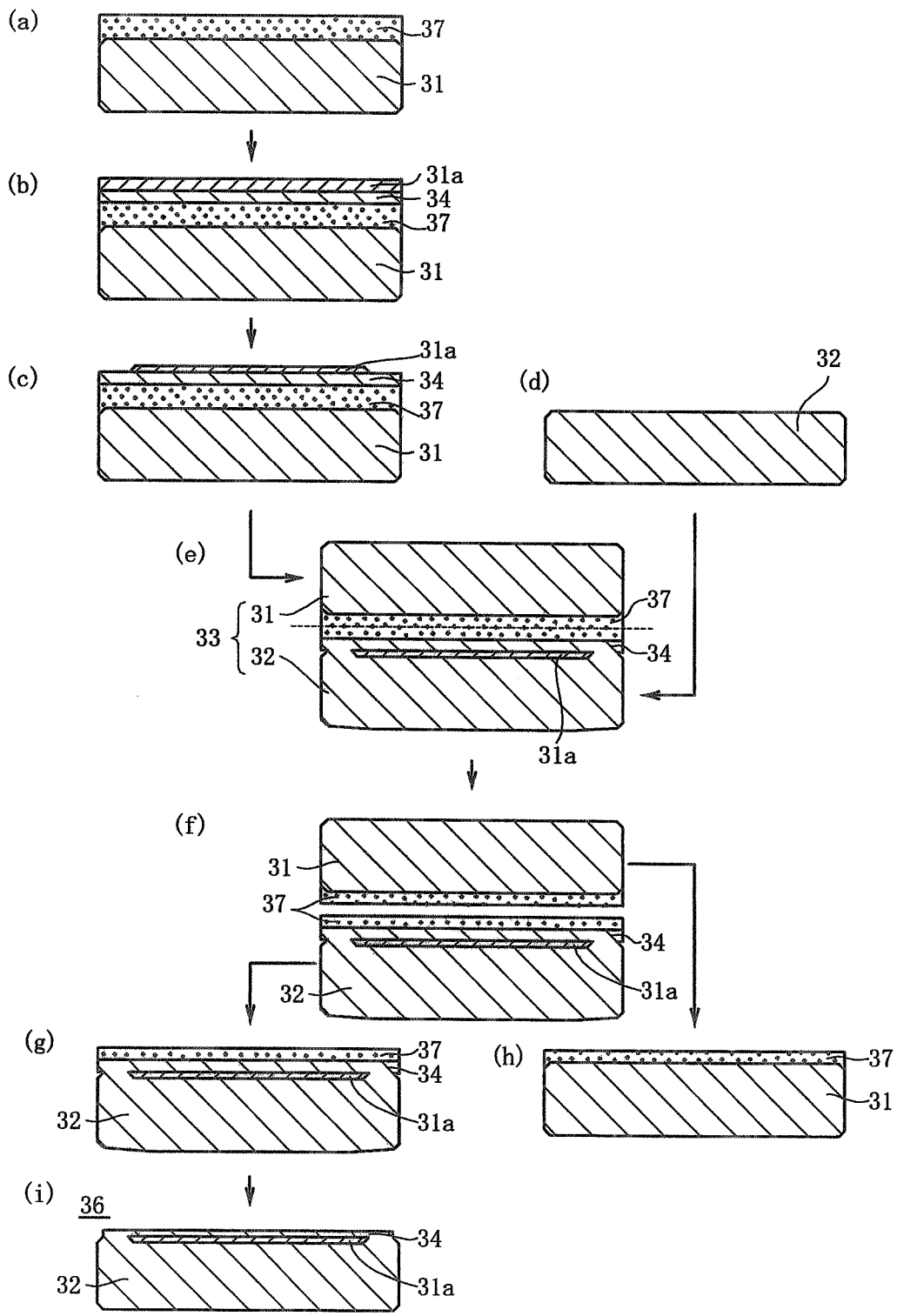
FIG. 3 is a diagram showing the method for manufacturing a direct bonded SOI wafer in the third preferred embodiment of the present invention in the order of processes.

As shown in FIG. 3, in this third preferred embodiment, film-thinning of the semiconductor wafer 31 in process (B) is carried out by a so-called ELTRAN method that a poromeric porous silicon layer 37 is produced by anodization on the main surface on the laminating side of the semiconductor wafer 31 and on the chamfered portion continuing to the main surface, a single crystal silicon thin-film layer 34 is formed on the porous silicon layer 37 by epitaxial growth after a hydrogen annealing treatment in this order, the oxide film 31*a* is formed on the main surface on the laminating side of either of the single crystal silicon thin-film layer 34 or the support wafer 32 and on a chamfered portion continuing to the main surface, and the semiconductor wafer 31 is separated and removed from the single crystal silicon thin-film layer 34 in the porous silicon layer 37 by applying heat treatment to the laminated body 33 after the laminating step at a predetermined temperature.

In the case of this film-thinning, first, the poromeric porous silicon layer 37 is produced by anodization on the main surface on the laminating side of the semiconductor wafer 31 and on the chamfered portion continuing to the main surface before the laminated body 33 is formed (FIG. 3(*a*)). Then, the single crystal silicon thin-film layer 34 and the silicon oxide film (SiO$_2$ film) 31*a*, which is an insulating film, are formed on the poromeric porous silicon layer 37 by epitaxial growth after a hydrogen annealing treatment on the porous silicon layer 37 (FIG. 3(*b*)).

Then, in the oxide film formed on the semiconductor wafer 31, the oxide film formed on the circumferential end edge on the main surface on the laminating side and the chamfered portion is removed and the oxide film is left only on the laminated surface except the circumferential end edge (FIG. 3(*c*)). In this process, the oxide film formed on the circumferential end edge and the chamfered portion is removed by the same method as in the above-mentioned first preferred embodiment. Next, the support wafer 32 is prepared (FIG. 3(*d*)), and the semiconductor wafer 31 is laminated on the main surface of this support wafer 32 via the oxide film 31*a* at a room temperature so as to form the laminated body 33 (FIG. 3(*e*)). Heat treatment is carried out that the temperature of this laminated body 33 is raised to a range of 900 to 1200° C. in an atmosphere of oxygen (O$_2$) or nitrogen (N$_2$) and kept in this temperature range for 30 to 120 minutes. After cooling, cutting is carried out by a mechanical force and separated in the portion of the porous layer (FIG. 3(*f*)). Moreover, the separated surface of the support wafer 32 is subjected to hydrogen annealing-treatment to smooth the thin film layer 34 (FIGS. 3(*g*) and 3(*i*)). By this, the SOI wafer 36 in which the buried oxide film 31*a* is not exposed from the side face can be obtained. The separated semiconductor wafer 31 shown in FIG. 3*h* can be reused by removing the porous silicon layer 37 by polishing the separated surface and then, forming the porous silicon layer 37 by anodization again.

Moreover, a method for manufacturing a direct bonded SOI wafer in the fourth preferred embodiment will be described based on FIG. 4.

Figure 4:
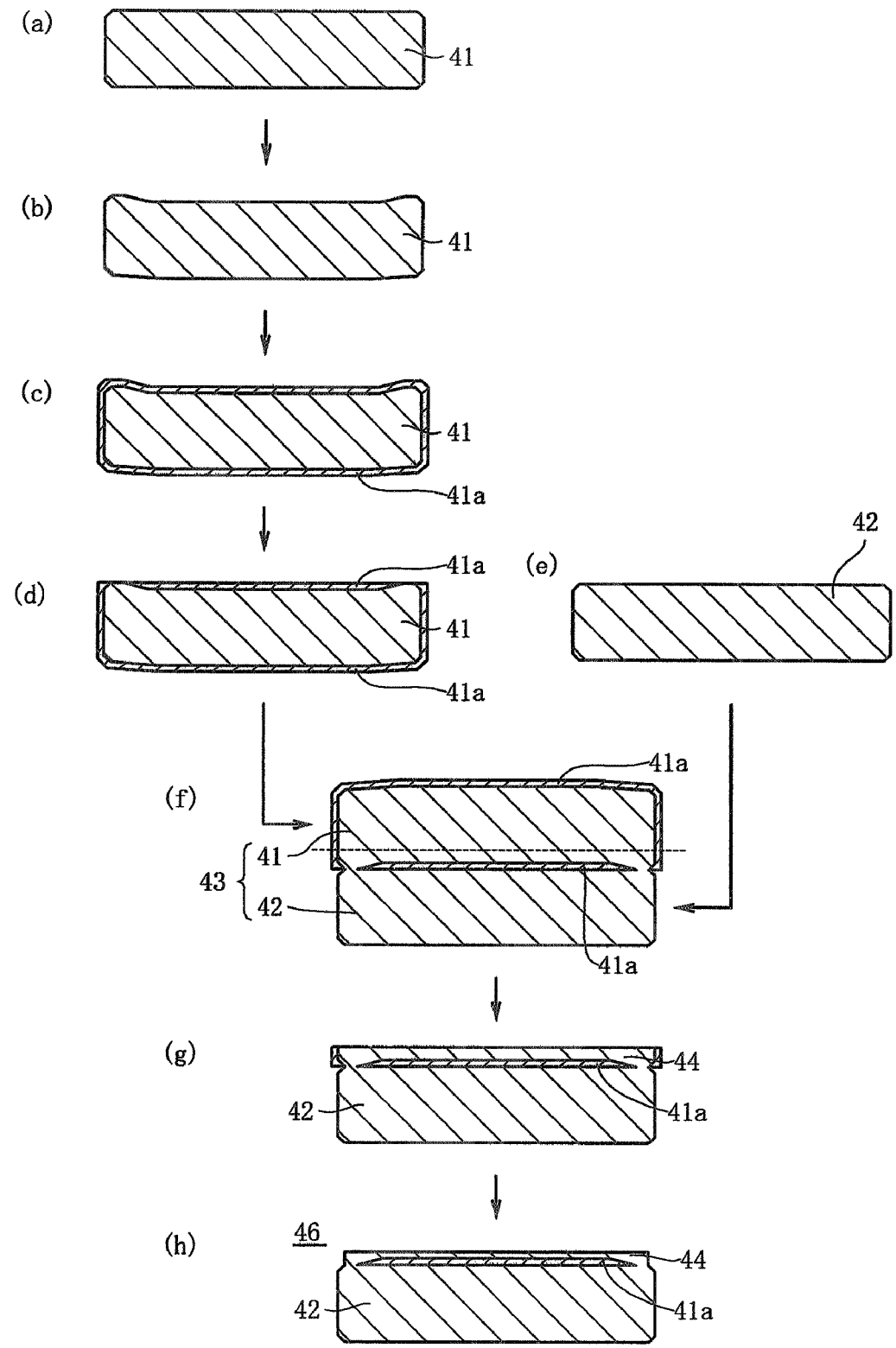
FIG. 4 is a diagram showing the method for manufacturing a direct bonded SOI wafer in the fourth preferred embodiment of the present invention in the order of processes.

As shown in FIG. 4, in this fourth preferred embodiment, firstly, in a semiconductor wafer 41 before a laminated body 43 is formed by lamination, only the center part is polished so as to form the circumferential end edge of the wafer in a convex shape (FIGS. 4(*a*) and 4(*b*)). In this process, by using the same method as that for removing the oxide film by polishing in the first preferred embodiment, the thickness at the center part is thin and the thickness of the circumferential edge and the chamfered portion has the same thickness as that before polishing, that is, the process can be carried out so that the sectional shape of the wafer 41 is in the recess state. Next, by thermal oxidation, an oxide film (SiO.sub.2 film) 41*a*, which is an insulating film, is formed on the main surface of the wafer 11 (FIG. 4(*c*)). Next, in the oxide film formed on the semiconductor wafer 41, the oxide film formed on the circumferential end edge on the main surface on the laminating side and the chamfered portion is removed and the oxide film is left only on the laminated surface except the circumferential end edge (FIG. 4(*d*)). In this process, by polishing the wafer surface with a normal polishing method and by polishing to the thickness of such a degree as to remove the oxide film on the wafer circumferential end edge and the chamfered portion, only the oxide film located at the wafer center part can be left. The subsequent processes, that is, the processes shown in FIGS. 4(*f*) to 4(*h*) are the same as those in the first preferred embodiment.

The direct bonded SOI wafer manufactured by the method for manufacturing the direct bonded SOI wafer in the above first to the fourth preferred embodiments of the present invention can have the same quality as the normal silicon wafer since the side of the buried oxide film is not exposed.

As mentioned above, the method for manufacturing the direct bonded SOI wafer of the present invention is the improvement of a method for manufacturing a direct bonded SOI wafer comprising the process the process of (A) forming a laminated body by laminating a semiconductor wafer and a support wafer using an oxide film; and (B) forming a thin-film single crystal silicon layer on the support wafer using a buried oxide film layer by film-thinning the semiconductor wafer to a predetermined thickness, wherein a process (C) the entire buried oxide film layer is covered by a main surface on the laminating side of the support wafer and the single crystal silicon layer. More specifically, the covering of the entire buried oxide film layer is carried out by, between process (A) and (B), removing the oxide film formed on the circumferential end edge of the main surface on the laminating side and the chamfered portion to leave the oxide film only on the laminated surface except the circumferential end edge. By the above method, the entire buried oxide film layer is covered, and the direct bonded SOI wafer not exposed can be manufactured.

What is claimed is:

1. A method for manufacturing a direct bonded SOI wafer comprising forming a laminated body having first and second main surfaces by laminating a semiconductor wafer on a laminating side of a support wafer via an oxide film; and forming a thin-film single crystal silicon layer on said support wafer by thinning said semiconductor wafer on the side opposite the laminating side wherein:

before the laminated body is formed by lamination, only the center part of the semiconductor wafer is polished so as to form a circumferential end edge in a convex shape on the laminating side, and then an oxide film which is an insulating film, is formed on the surface of the semiconductor wafer by thermal oxidation, and the oxide film formed on the circumferential end edge is removed and the oxide film is left on the laminating side except for the circumferential end edge thereby forming a buried oxide layer, and the entire buried oxide film layer is covered by a main surface on the laminating side of said support wafer and said single crystal silicon layer.

2. The method for manufacturing the direct bonded SOI wafer of claim 1, wherein the film-thinning of the semiconductor wafer is carried out by mechanical processing, chemical etching or gas-phase etching of said semiconductor wafer.

3. The method for manufacturing the direct bonded SOI wafer of claim 2, wherein the film-thinning of the semiconductor wafer is carried out by mechanical processing comprising grinding and polishing the side opposite to the laminating side of said semiconductor wafer after the laminating step.

4. The method for manufacturing the direct bonded SOI wafer of claim 2, wherein the film-thinning of the semiconductor wafer is carried out by mechanical processing comprising cutting said semiconductor wafer parallel to the main surface after the laminating step.

5. The method for manufacturing the direct bonded SOI wafer of claim 1, wherein the removal of the oxide film formed on the circumferential end edge is carried out by polishing.

6. The method for manufacturing the direct bonded SOI wafer of claim 1, wherein the removal of the oxide film formed on the circumferential end edge is carried out by chemical etching.

7. The method for manufacturing the direct bonded SOI wafer of claim 6, wherein the chemical etching is carried out with an HF solution with the weight ratio of $HF:H_2O$ within a range of 1:0 to 10.

8. The method for manufacturing the direct bonded SOI wafer of claim 1, wherein the main surface of the laminating side of the semiconductor wafer, the support wafer or both is laminated after washing with an SC-1 solution under an oxidized atmosphere.

9. The method for manufacturing the direct bonded SOI wafer of claim 1, wherein the main surface of the laminating side of the semiconductor wafer, the support wafer or both is laminated after washing with a solution containing an organic acid and ozone under an oxidized atmosphere.

10. The method for manufacturing the direct bonded SOI wafer of claim 1, wherein the main surface of the laminating side of the semiconductor wafer, the support wafer or both is laminated after washing with a diluted HF solution wherein the weight ratio of $HF:H_2O$ is within a range of 1:50 to 400.

11. A direct bonded SOI wafer manufactured by the method of claim 1.

12. A direct bonded SOI wafer manufactured by the method of claim 2.

13. A direct bonded SOI wafer manufactured by the method of claim 3.

14. A direct bonded SOI wafer manufactured by the method of claim 4.

15. A direct bonded SOI wafer manufactured by the method of claim 5.

16. A direct bonded SOI wafer manufactured by the method of claim 6.

17. A direct bonded SOI wafer manufactured by the method of claim 7.

18. A direct bonded SOI wafer manufactured by the method of claim 8.

19. A direct bonded SOI wafer manufactured by the method of claim 9.

20. A direct bonded SOI wafer manufactured by the method of claim 10.

* * * * *